(12) United States Patent
Aoki

(10) Patent No.: US 10,381,978 B2
(45) Date of Patent: Aug. 13, 2019

(54) ELECTRONIC-COMPONENT PACKAGE, OSCILLATOR, ELECTRONIC APPARATUS, AND VEHICLE

(71) Applicant: SEIKO EPSON CORPORATION, Tokyo (JP)

(72) Inventor: Shinya Aoki, Minowa-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 49 days.

(21) Appl. No.: 15/716,853

(22) Filed: Sep. 27, 2017

(65) Prior Publication Data
US 2018/0097474 A1 Apr. 5, 2018

(30) Foreign Application Priority Data
Oct. 3, 2016 (JP) .................................. 2016-195452

(51) Int. Cl.
| | |
|---|---|
| H01L 41/047 | (2006.01) |
| H03B 5/32 | (2006.01) |
| H03B 1/02 | (2006.01) |
| H03B 5/04 | (2006.01) |

(52) U.S. Cl.
CPC ........... *H03B 1/02* (2013.01); *H01L 41/0472* (2013.01); *H03B 5/04* (2013.01); *H03B 5/32* (2013.01); *H03B 2200/0018* (2013.01)

(58) Field of Classification Search
CPC ............. H01L 41/0471; H01L 41/0472; H01L 41/0474; H03B 5/30; H03B 5/32; H03H 9/0538

USPC .................................... 331/68, 69, 154, 158
See application file for complete search history.

(56) References Cited

U.S. PATENT DOCUMENTS

| | | | | |
|---|---|---|---|---|
| 5,949,294 A | * | 9/1999 | Kondo | ..................... H01L 23/58 310/340 |
| 6,229,249 B1 | * | 5/2001 | Hatanaka | ................... H03B 5/04 310/348 |
| 6,445,254 B1 | * | 9/2002 | Shibuya | .................... H03B 5/32 257/701 |
| 6,917,142 B2 | * | 7/2005 | Koyama | .............. H03H 9/0547 310/344 |

(Continued)

FOREIGN PATENT DOCUMENTS

| | | |
|---|---|---|
| JP | 4784055 B2 | 9/2011 |
| JP | 5276773 B2 | 8/2013 |
| JP | 2015-053536 A | 3/2015 |

*Primary Examiner* — Levi Gannon
(74) *Attorney, Agent, or Firm* — Oliff PLC

(57) ABSTRACT

A package includes a first layer on which a quartz crystal resonator element is mounted; a second layer that is joined to the first layer and on which a circuit element mounted; a third layer that is joined to a surface of the second layer that is opposite in direction to a surface of the second layer, on which the circuit element is mounted; a connection pad that is provided on the first layer; an external lateral surface terminal that is electrically connected to the connection pad; resonance element wiring that electrically connects the connection pad and the external lateral surface terminal to each other, in which the resonance element wiring is positioned between the third layer and the second layer, and includes terminal wiring that is connected to the external lateral surface terminal and interlayer wiring that connects the connection pad and the terminal wiring.

20 Claims, 9 Drawing Sheets

(56) References Cited

U.S. PATENT DOCUMENTS

| | | | |
|---|---|---|---|
| 7,378,780 B2 | 5/2008 | Mizumura et al. | |
| 7,764,138 B2* | 7/2010 | Harima | H03H 9/0547 |
| | | | 331/158 |
| 9,363,895 B2* | 6/2016 | Matsuzawa | H03H 9/0542 |
| 2006/0238264 A1* | 10/2006 | Hatanaka | H03L 1/04 |
| | | | 331/158 |
| 2007/0241830 A1* | 10/2007 | Harima | H03B 5/36 |
| | | | 331/158 |
| 2008/0309418 A1* | 12/2008 | Fukunaga | H03H 9/0552 |
| | | | 331/68 |
| 2013/0162362 A1* | 6/2013 | Harima | H03B 5/32 |
| | | | 331/155 |
| 2013/0187723 A1* | 7/2013 | Harima | H03B 5/36 |
| | | | 331/158 |
| 2013/0257549 A1* | 10/2013 | Asamura | H03H 9/0538 |
| | | | 331/68 |

* cited by examiner

ELECTRONIC-COMPONENT PACKAGE, OSCILLATOR, ELECTRONIC APPARATUS, AND VEHICLE

CROSS REFERENCE

This application claims benefit of Japanese Application JP 2016-195452, filed on Oct. 3, 2016. The disclosure of the prior application is hereby incorporated by reference herein in its entirety.

BACKGROUND

1. Technical Field

The present invention relates to an electronic-component package, an oscillator, an electronic apparatus, and a vehicle.

2. Related Art

In the field of communication apparatus in the related art, in order to obtain a signal at a stable frequency, a resonance element (a quartz crystal resonance plate) that is formed of a piezoelectric material, such as quartz crystal is accommodated (stored) in an electronic-component package, and a piezoelectric device, such as a quartz crystal resonator or a quartz oscillator, which can obtain a signal at a desired frequency has been used.

As such a piezoelectric device, an oscillator is disclosed into which a piezoelectric resonator element and an electronic device, such as an IC or an LSI, are mounted using an electronic-component package in which a second layer that has a through-hole in the center portion and is formed in the shape of a frame is stacked on a first layer that is formed in the shape of a rectangle, and in which a third layer that is formed in the shape of a frame is stacked on the second layer (for example, refer to JP-A-2015-53536). Included in the electronic-component package that is used for such an oscillator are a first connection electrode (a connection pad) that connects to a piezoelectric resonator element which is accommodated in the electronic-component package, and a second connection electrode (terminal wiring) that connects to the first connection electrode and a castellation electrode (an external lateral surface terminal) that is provided on an external lateral surface of the electronic-component package. Then, in a frame-shaped portion of the second layer, the second connection electrode (terminal wiring) is positioned between an area of the stacked second layer and third layer.

However, in an electronic-component package that is used for piezoelectric oscillator that is disclosed in JP-A-2015-53536, the second connection electrode that connects to the first connection electrode and the castellation electrode that is provided on the external lateral surface of the electronic-component package is positioned on the frame-shaped area of the stacked second layer and third layer, which constitutes a cavity in which a piezoelectric resonator element and the like are accommodated, and because of this, a ratio of a width of the second connection electrode to a width of the frame shaped second layer is increased. Accordingly, there is a concern that insufficient stacking strength of the second layer and the third layer of the electronic-component package will cause interlayer delamination to occur and cause the airtightness to deteriorate. Particularly, in a configuration of such a piezoelectric oscillator, further in a case where the miniaturization, thereof advances, because the width of the frame-shaped second layer in the electronic-component package is also decreased, there is a concern that such a trend will be further increased and thus an influence thereof will be remarkable.

SUMMARY

An advantage of some aspects of the invention is to solve at least a part of the problems described above, and the invention can be implemented as the following forms or application examples.

Application Example 1

An electronic-component package according to this application example includes: a first layer that has an opening portion and on which a resonance element is mounted; a second layer that covers the opening portion and is joined to the first layer, and on which a circuit element is mounted in the opening portion; a third layer that is joined to a surface of the second layer, which is opposite in direction to a surface of the second layer, on which the circuit element is mounted; a connection pad that is provided on the first layer and is connected to the resonance element; an external lateral surface terminal that is electrically connected to the connection pad; and resonance element wiring that electrically connects the connection pad and the external lateral surface terminal to each other, in which the resonance element wiring includes terminal wiring that is positioned between the third layer and the second layer and is connected to the external lateral surface terminal and interlayer wiring that connects the connection pad and the terminal wiring to each other.

In the electronic-component package according to this application example, the terminal wiring that connects the connection pad and the external lateral surface terminal to each other through the resonance element wiring is provided between the second layer and the third layer that are not formed to configure the opening portion (a cavity) which is an internal space into which the resonance element and the circuit element are mounted. Because the second layer and the third layer are interlayers between which the opening portion (the cavity) is not configured, and there is a wide plane area between the second layer and the third layer, although the terminal wiring is provided, an area of the stacked second layer and third layer can be sufficiently secured and stacking strength of the second layer and the third layer can be sufficiently obtained. Accordingly, a concern that the airtightness will deteriorate due to interlayer delamination or the like can be reduced.

Application Example 2

In the electronic-component package according to the application example, it is preferable that a width of the terminal wiring is equal to or greater than 0.05 mm and equal to or smaller than 0.3 mm.

According to this application example, while conductivity reliability of the wiring is secured by setting a lower limit value of the width of the terminal wiring to 0.05 mm, the terminal wiring that has the difficulty of being influenced by a change in characteristic due to capacitive coupling can be set by setting an upper limit value to 0.3 mm.

Application Example 3

In the electronic-component package according to the application example, it is preferable that the width of the terminal wiring is equal to or greater than 0.2 mm and equal to or smaller than 0.25 mm.

According to this application example, while conductivity reliability of the terminal wiring can be more increased by setting the lower limit value of the width of the terminal wiring to 0.2 mm, the terminal wiring that has the increased difficulty of being influenced by the change in characteristic due to the capacitive coupling can be set by setting the upper limit value to 0.25 mm.

Application Example 4

In the electronic-component package according to the application example, it is preferable that at least wiring that is electrically connected to the circuit element is provided on the second layer, and among the pieces of wiring, wiring that is electrically connected to the circuit element and is not connected to the resonance element is positioned in a position that does not overlap the resonance element wiring when viewed from above.

According to this application example, the capacitive coupling to the terminal wiring can be made to have the difficulty of occurrence. Accordingly, an influence of a change in characteristic due to the capacitive coupling can be decreased.

Application Example 5

In the electronic-component package according to the application example, it is preferable that the external lateral surface terminal is positioned on external lateral surfaces of the first layer and the second layer, and provided across the first layer and the second layer.

According to this application example, an area of the external lateral surface terminal can be increased that is electrically connected to the connection pad, and the number of contact failures in a case where a probe or the like is caused to come into contact with the external lateral surface terminal can be decreased.

Application Example 6

An oscillator according to this application example includes the electronic-component package according to any one of application examples; a resonance element that is accommodated in the electronic-component package; and a circuit element that includes at least an oscillation circuit of the resonance element.

In the oscillator according this application example, the resonance element and the circuit element are accommodated in the electronic-component package using the electronic-component package that can make it difficult for deterioration in airtightness due to the interlayer delamination or the like to occur and can make it difficult for the capacitive coupling to the terminal wiring to occur. Thus, the high-reliability oscillator can be provided.

Application Example 7

An electronic apparatus according to this application example includes an electronic component that includes the electronic-component package according to any one of application examples.

In the electronic apparatus according to this application example, the electron component is included that uses the electronic-component package that can make it difficult for the deterioration in airtightness due to the interlayer delamination or the like to occur and can make it difficult for the capacitive coupling to the terminal wiring to occur. Thus, the high-reliability electronic apparatus can be provided.

Application Example 8

A vehicle according to this application example includes the electronic-component package according to any one of application example.

In the vehicle according to this application example, the electronic component is included that uses the electronic-component package that can make it difficult for the deterioration in airtightness due to the interlayer delamination or the like to occur and can make it difficult for the capacitive coupling to the terminal wiring to occur. Thus, the high-reliability vehicle can be provided.

BRIEF DESCRIPTION OF THE DRAWINGS

The invention will be described with reference to the accompanying drawings, wherein like numbers reference like elements.

DESCRIPTION OF EXEMPLARY EMBODIMENTS

Preferable embodiments of the invention will be described below with reference to the accompanying drawings. It is noted that for the convenience of description, each figure illustrates three axes that intersect each other, the X axis, the Y axis, and the Z axis, and that a direction in parallel to the X axis, a direction in parallel to the Y axis, a direction in parallel to the Z axis are referred to an "X axis direction", "Y axis direction", and "Z axis direction", respectively.

Furthermore, in some cases, the +Z axis side is referred to "the top", "the upward direction", "the front", or "the front side", and the −Z axis side is referred to "the bottom", "the downward direction", "the rear", or "the rear side".

Figure 1:
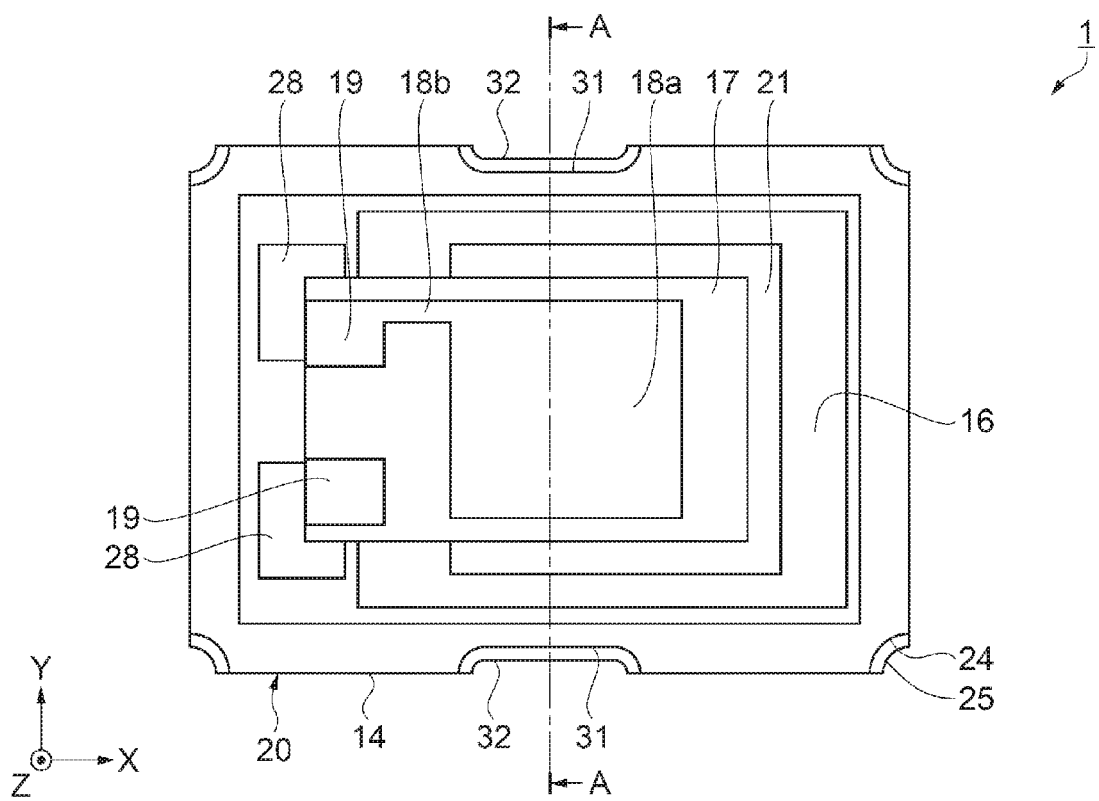
FIG. 1 is a plan diagram illustrating an outline of an oscillator as an electronic component that uses an electronic-component package according to an embodiment of the invention.
Figure 2:
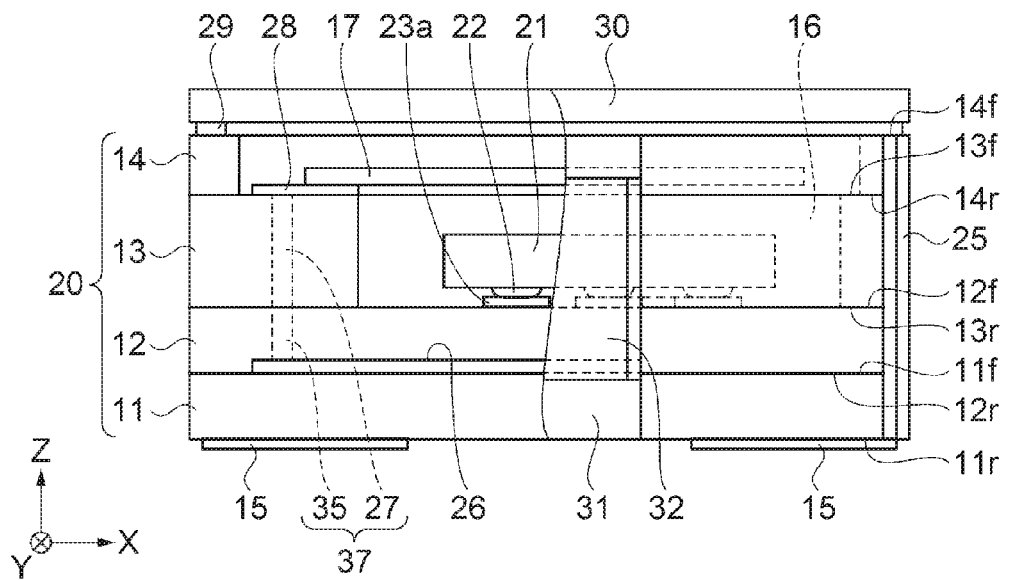
FIG. 2 is a front diagram (a partial cross-sectional diagram) illustrating an outline of the oscillator as the electronic component.
Figure 3:
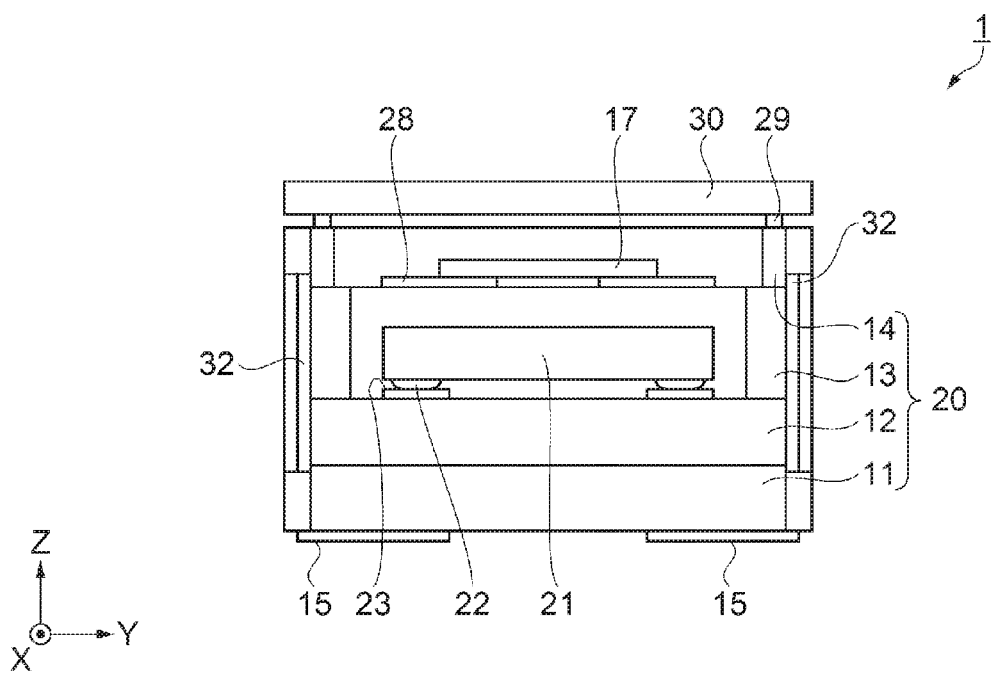
FIG. 3 is a cross-sectional diagram (lateral surface diagram) taken along line A-A in FIG. 1, which illustrates an outline of the oscillator as the electronic component.

An oscillator an electronic component according to the embodiment of the invention is described with reference to FIGS. 1, 2, and 3. FIGS. 1, 2, and 3 illustrate an outline of the oscillator as the electronic component according to the embodiment of the invention. FIG. 1 is a plan diagram. FIG. 2 is a front diagram (a partial cross-sectional diagram). FIG. 3 is a cross-sectional diagram (a lateral surface diagram) taken along line A-A in FIG. 1. It is noted that in FIG. 1, a lid 30 and a seam ring 29 that are illustrated in FIG. 2 are omitted (seen in proper perspective).

An oscillator 1 as an electronic component according to the embodiment of the invention, as illustrated in FIGS. 1, 2 and 3, is a so-called temperature compensated X'tal oscillator (TCXO) that accommodates (stores) a quartz crystal resonator element 17 as a resonance element and a circuit element 21, within a package 20 as an electronic-component package. The oscillator 1 has the quartz crystal resonator element 17, the circuit element 21 which includes at least an oscillation circuit that causes the quartz crystal resonator element 17 to oscillate, or a circuit (temperature compensation circuit) which compensates for a temperature characteristic that is retained by the quartz crystal resonator element 17, the package 20 (an electronic-component package) that accommodates the quart z crystal resonator element 17 and the circuit element 21, and the lid 30 as a cover part that forms an internal space (storage space 16) between the cover part itself and the package 20. The quartz crystal resonator element 17, the package 20, the circuit element 21, and the lid 30 as the opening part will be described sequentially in detail below.

Quartz Crystal Resonator Element as the Resonance Element

As the quartz crystal resonator element 17 according to the present embodiment, an AT cut quartz crystal substrate (a piezoelectric substrate) that is formed of quartz crystal, as an example of a piezoelectric material, is used. Although not illustrated, a piezoelectric material, such as quartz crystal, belongs to a trigonal system, and has quartz crystal axes X, Y, and Z that intersect each other at right angles. The X axis, the Y axis, and the Z axis are called an electrical axis, a mechanical axis, and an optic axis, respectively. Then, as a quartz crystal substrate, a plate is used that is cut from quartz crystal, along a plane that results from rotating the XZ plane about the X axis by a predetermined angle θ. For example, in the case of the AT cut quartz crystal substrate, θ is approximately 35°15'. It is noted that it is decided that a Y' axis and a Z' axis result from rotating the Y axis and the Z axis, respectively, about the X axis by a θ angle. Therefore, the AT cut quartz crystal substrate has crystal axes X, Y', and Z' that intersect at right angles. The thickness direction of the AT cut quartz crystal substrate is along the Y' axis. The principle surface thereof is an XZ' plane (which includes the X axis and the Z' axis) that intersects the Y's axis. Thickness slide resonance, as primary resonance, is caused to provide resonance. The AT cut quartz crystal substrate is processed, and thus piezoelectric substrate can be obtained as an element plate of the quartz crystal resonator element 17. That is, the piezoelectric substrate is made from the AT cut quartz crystal substrate that is configured with a surface parallel to the X axis and the Z' axis and has the thickness in the direction parallel to the Y' axis, when it is decided that the Z' axis results from inclining the Z axis in the −Y direction of the Y axis, and that the Y' axis results from inclining the Y axis in the +Z direction of the Z axis, in a state where the X axis of the orthogonal coordinate system that is made from the X axis (the electrical axis), the Y axis (the mechanical axis), and the Z axis (the optical axis) is defined as the center.

It is noted that the quartz crystal substrate according to the invention is not limited to an AT cut with the angle θ of approximately 35°15' as described above, and other piezoelectric substrates, such as an SC cut and a BT cut, which cause the thickness slide resonance to provide resonance, can also find application.

When it comes to the quartz crystal resonator element 17 according to the present embodiment, various electrodes are provided on a front or rear surface (a principle surface) of an element piece of the AT cut quartz crystal substrate (piezoelectric substrate) that is formed in the shape of a rectangle, of which a material is quartz crystal as an example of the piezoelectric material. As electrodes in the present example, a resonance electrode 18a, a connection electrode 19, and an extraction electrode 18b that connects the resonance electrode 18a and the connection electrode 19 are formed. It is noted that in FIG. 2, for the convenience of reading from the drawings, illustrations of various electrodes are omitted.

The resonance electrode 18a is provided, in the shape of approximately a rectangle, on the center portion of a front- or rear-side principle surface of the quartz crystal resonator element 17. Furthermore, the connection electrode 19 extends from the resonance electrode 18a up to an end portion of one of the front- and rear-side principal surfaces, with the extraction electrode 18b in between. It is noted that the resonance electrode 18a and the connection electrode 19 are provided in such a manner as to face each other in almost the same shape.

Electronic-Component Package

Figure 4:
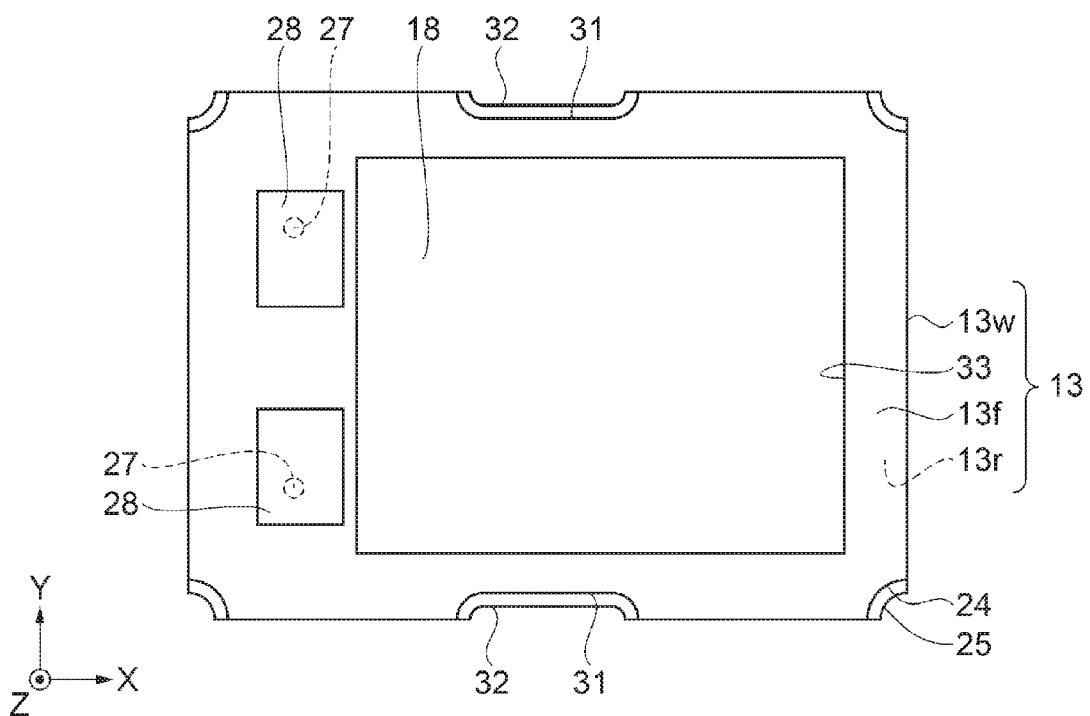
FIG. 4 is a plan diagram illustrating an electrode pattern that is provided on a first layer of the electronic-component package.
Figure 5:
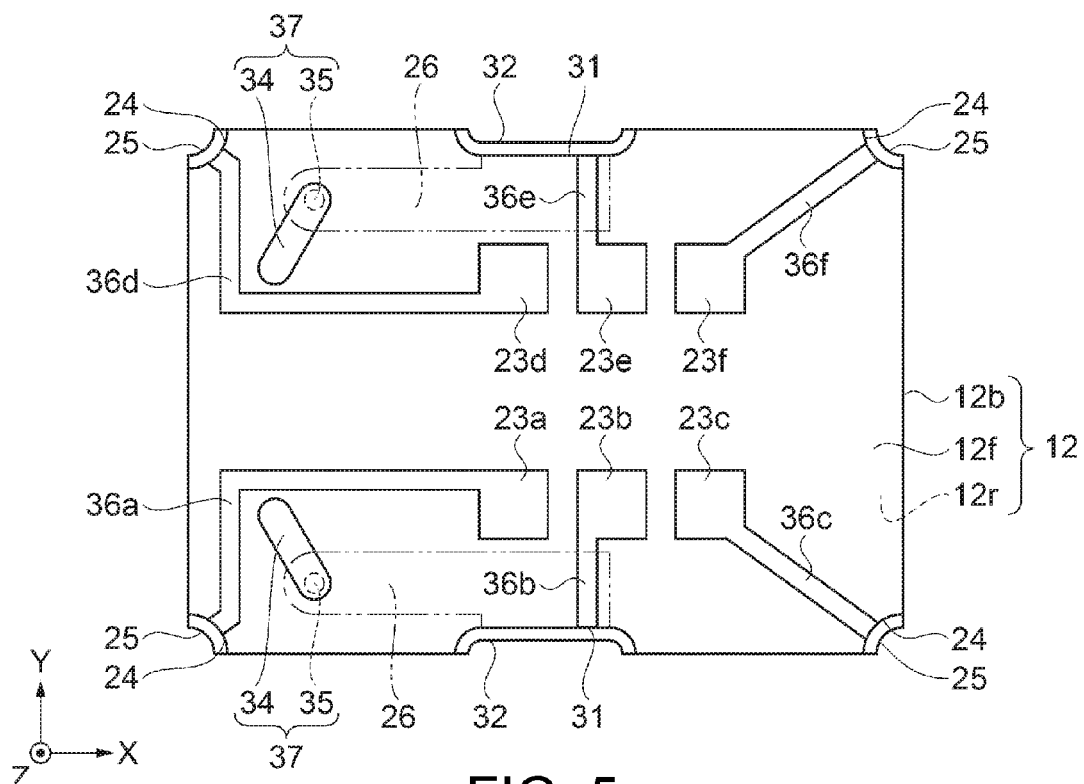
FIG. 5 is a plan diagram illustrating an electrode pattern that is provided on a second layer of the electronic-component package.
Figure 6:
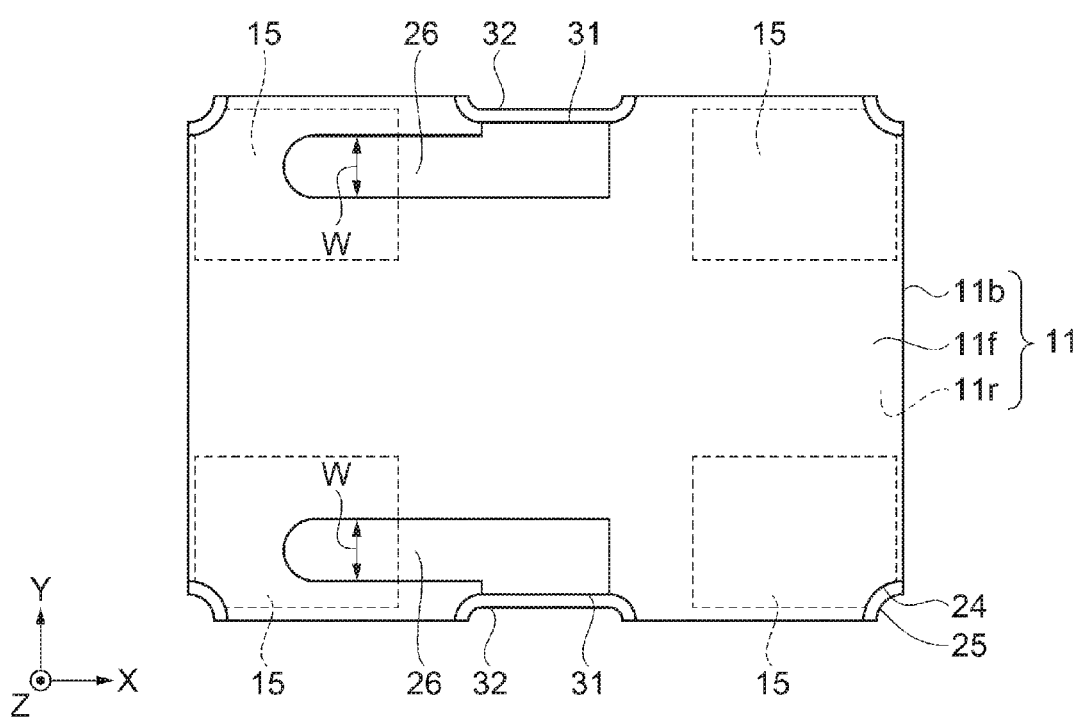
FIG. 6 is a plan diagram illustrating an electrode pattern that is provided on a third layer of the electronic-component package.

Next, the package 20 as the electronic-component package is described with reference to FIGS. 4, 5, and 6 in addition to FIGS. 1, 2, and 3. FIG. 4 is a plan diagram illustrating an electrode pattern that is provided on a first layer of the electronic-component package. FIG. 5 is a plan diagram illustrating an electrode pattern that is provided on a second layer of the electronic-component package. FIG. 6 is a plan diagram illustrating an electrode pattern that is provided on a third layer of the electronic-component package.

The package 20 as the electronic-component package includes a plate-shaped base plate 11, as the third layer, a plate-shaped intermediate plate 12, as the second layer that is joined to a front surface 11f of the base plate 11, a frame-shaped frame plate 13, as the first layer that is joined to a peripheral portion of a front surface 12f of the intermediate plate 12, and a frame-shaped sidewall 14, which is joined to a peripheral portion of a front surface 13f of the frame plate 13. The seam ring 29, which is used as a joining material that joins the lid 30 as the cover part that will be described below, is provided on a front surface 14f of the sidewall 14.

The package 20 has a concavity portion (an internal space 16) that is exposed to the upper surface. An opening in the concavity portion is covered by the lid 30 as the cover part that is joined to the sidewall 14 through the seam ring 29 as the joining material. Then, the internal space 16 that is sealed by the opening in the concavity of the package 20 being covered by the lid 30 is formed. An internal pressure of the sealed internal space 16 can be set to be a desired atmospheric pressure. For example, the internal space 16 is filled with nitrogen gas in such a manner that the quartz crystal resonator element 17 self is set to be at atmospheric pressure, or to be in a vacuum (a state in which the space is filled with gas at a pressure (which is equal to or higher than $1 \times 10^5$ Pa to $1 \times 10^{-10}$ Pa (JIS Z 8126-1: 1999))) lower than a normal atmospheric pressure). In this case, the quartz crystal resonator element 17 can continue vibration more stably. It is noted that the internal space 16 according to the present embodiment is set to be in the vacuum described above.

A castellation 24 that is recessed inward extending from the base plate 11 to the sidewall 14 is provided at each of the four corners of the outer periphery of the package 20. Then, a castellation electrode 25 is provided within each of the castellation 24. Furthermore, four external connection terminals 15 are provided on a rear surface 11r of the base plate 11 that is a bottom surface of the package 20. It is noted that although not illustrated, the castellation electrodes 25 are connected to the external connection terminals 15, respectively.

Furthermore, a concavity portion 31 that is recessed inward extending from the base plate 11 to the sidewall 14 is provided at each of the external lateral surfaces along the X axis in an illustration of the package 20. Then, an external lateral surface terminal 32 is provided within each of the concavity portions 31. It is desirable that the external lateral surface terminal 32 is provided at least across the intermediate plate 12 (the second layer) and the frame plate 13 (the first layer).

In the present embodiment, the external lateral surface terminal 32 is positioned in such a manner as to be across one portion of the base plate 11 and one portion of the sidewall 14. By disposing the external lateral surface terminal 32 in this manner, an area of the external lateral surface terminal 32 can be increased and the number of contact failures in a case where a probe or the like is caused to come into contact with the external lateral surface terminal 32 can be decreased.

It is noted that the external lateral surface terminal 32 may be configured to be provided extending from within the concavity portion 31 to an external lateral surface of the package 20, or to be provided on the external lateral surface of the package 20, without being configuring to be provided within the concavity portion 31.

The frame plate 13 as the first layer, as illustrated in FIG. 4, is configured with a frame-shaped member 13w, which results from providing a through-hole 33, which pierces through the front surface 13f that is on the sidewall 14 side and a rear surface 13r that is opposite in direction to the front surface 13f, as an opening portion in the center portion of a plate-shaped member that has an approximately rectangle-shaped lateral surface when viewed from above. The castellation 24 and the castellation electrode 25 are provided at each of the four corners of the periphery of the frame plate 13, and the concavity portion 31 and the external lateral surface terminal 32 are provided in each of the two lateral surfaces along the X axis in the drawing. Furthermore, two connection pads 28 that are electrically connected to the connection electrode 19 of the quartz crystal resonator element. 17 are provided on the front surface 13f, which is on the sidewall 14 side of the frame plate 13. The quartz crystal resonator element 17 is mounted on the connection pads 28.

First interlayer wiring 27 as interlayer wiring that constitutes resonance element wiring 37 is provided in a position on the frame plate 13, which overlaps the connection pad 28 when viewed from above. The first interlayer wiring 27 here is electrically conductive wiring that is electrically connected to the connection pad 28 on the front surface 13f side and that pierces through the front surface 13f of the frame plate 13 first and then the rear surface 13r thereof. The first interlayer wiring 27 is a through electrode that is also called a via, and is formed by burying (depositing) a satisfactory conductive member, for example, such as copper (Cu), into a through-hole that pierces through the front surface 13f of frame plate 13 first and then the rear surface 13r thereof.

The intermediate plate 12 as the second layer, as illustrated in FIG. 5, has the shape of approximately a rectangle when viewed from above, and is configured with a plate-shaped member 12b that has the front surface 12f that is positioned to the frame plate 13 side and a rear surface 12r that is opposite in direction to the front surface 12f. The castellation 24 and the castellation electrode 25 are provided at each of the four corners of the periphery of the intermediate plate 12, and the concavity portion 31 and the external lateral surface terminal 32 are provided in each of the two lateral surfaces along the X axis in the drawing. Furthermore, on the intermediate plate 12, a junction electrode 34 that constitutes the resonance element wiring 37 is provided in a position that individually faces, in a one-to-one correspondence basis, the first interlayer wiring 27 that is provided on the frame plate 13.

Second interlayer wiring 35 as the interlayer wiring that constitutes the resonance element wiring 37 is provided in a position that overlaps the junction electrode 34 of the intermediate plate 12 when viewed from above. The second interlayer wiring 35 here is electrically conductive wiring that is electrically connected to the junction electrode 34 on the front surface 12f side and that pierces through the front surface 12f of the intermediate plate 12 first and then the rear surface 12r thereof. The second interlayer wiring 35 is a through electrode that is also called a via, and is formed by burying (depositing) a satisfactory conductive member, for example, such as copper (Cu), into a through-hole that pierces through the front surface 12f of the intermediate plate 12 first and then the rear surface 12r thereof. It is noted that the example in which the first interlayer wiring 27 and the second interlayer wiring 35 are electrically connected to each other through the junction electrode 34 is described, but the first interlayer wiring 27 and the second interlayer wiring 35 may be configured to be directly connected to each other without providing the junction electrode 34.

Furthermore, bonding electrodes 23a, 23b, 23c, 23d, 23e, and 23f, as wiring that is connected to connection protrusions (bumps) 22 of the circuit element 21, are provided on the front surface 12f of the intermediate plate 12 that is positioned within the through-hole 33 in the frame plate 13. The bonding electrodes 23a, 23b, 23c, 23d, 23e, and 23f each are electrically connected to the castellation electrode 25 or the external lateral surface terminal 32. The circuit element 21 is positioned facing the bonding electrodes 23a, 23b, 23c, 23d, 23e, and 23f, and is mounted on the intermediate plate 12. It is noted that in the present embodiment, the bonding electrodes 23a, 23b, 23c, 23d, 23e, and 23f are configured to be connected to the connection protrusions (the bumps) 22, but a method of connecting bonding electrodes 23a, 23b, 23c, 23d, 23e, and 23f and the circuit element 21 is not limited to this. For example, the bonding electrodes 23a, 23b, 23c, 23d, 23e, and 23f may be configured to be electrically connected to the circuit element 21 with wire bonding.

Specifically, the bonding electrode 23a is connected by a wiring electrode 36a as wiring to the castellation electrode 25 at one corner. The bonding electrode 23b is connected by a wiring electrode 36b as wiring to one external lateral surface terminal 32. The bonding electrode 23c is connected by a wiring electrode 36c as wiring to the castellation electrode 25 at another corner. The bonding electrode 23d is connected by a wiring electrode 36d as wiring to the castellation electrode 25, which is positioned to be diagonally opposite to the castellation electrode 25 that is connected to the bonding electrode 23c. The bonding electrode 23e is connected by a wiring electrode 36e as wiring to the other one external lateral surface terminal 32. The bonding electrode 23f is connected by a wiring electrode 36f as wiring to the castellation electrode 25, which is positioned to be diagonally opposite to the castellation electrode 25 that is connected to the bonding electrode 23a.

It is preferable that in the wiring on the intermediate plate 12 (the front sur face 12f of the intermediate plate 12) that is electrically connected to the circuit element 21 described above, the boding electrodes 23a, 23c, 23d, and 23f, the wiring electrodes 36a, 36c, 36d, and 36f, and the like are arranged in positions that do not overlap terminal wiring 26 (which is indicated by a two-dot chain line in FIG. 5) that constitutes the resonance element wiring 37, which will be described below, when viewed from the Z axis direction in the drawing. It is noted that the bonding electrodes 23a, 23c, 23d, and 23f, the wiring electrodes 36a, 36c, 36d, and 36f, or the like are wiring that provides electrical connection to the circuit element 21, but does not provide connection to the quartz crystal resonator element 17. This arrangement pattern for wiring makes it difficult for capacitive coupling to the terminal wiring 26 (the resonance element wiring 37) to occur. Accordingly, an influence of a change in characteristic (a change in resonance characteristic) due to the capacitive coupling can be decreased. It is noted that because wiring (the bonding electrodes 23b and 23e or the wiring electrodes 36b and 36e) that is connected to the external lateral surface terminal 32 is at the same potential as the terminal wiring 26, although overlapping with of the terminal wiring 26 takes place, this does not impose any problem. Specifically, for example, because the bonding electrode 23b and the wiring electrode 36b are at the same potential as one of the pieces of terminal wiring 26, the overlapping may take place, and because the bonding electrode 23e and the wiring electrode 36e are at the same potential as the other one terminal wiring 26, the overlapping may take place. With this configuration, an area on the intermediate plate 12 can be effectively utilized.

The base plate 11 as the third layer, as illustrated in FIG. 6, has the shape of approximately a rectangle when viewed from above, and is configured with a plate-shaped member 11b that has the front surface 11f that is positioned to the intermediate plate 12 side, and the rear surface 11r that is opposite in direction to the front surface 11f. The castellation 24 and the castellation electrode 25 are provided at each of the four corners of the periphery of the base plate 11, and the concavity portion 31 is provided in each of the two lateral surfaces along the X axis in the drawing. The terminal wiring 26 that constitutes the resonance element wiring 37 is provided on the front surface 11f of the base plate 11.

The terminal wiring 26 is provided in the shape of a belt, extending from a position facing the second interlayer wiring 35, which is provided on the intermediate plate 12, to the external lateral surface terminal 32. The connection of the terminal wiring 26 to the external lateral surface terminal 32 makes it possible for two connection pads 28, which are electrically connected to the connection electrode 19 of the quartz crystal resonator element 17, to be electrically connected to the external lateral surface terminal 32, through the resonance element wiring 37 that corresponds to each of the two connection pads 28. In other words, the terminal wiring 26 is positioned between the base plate 11 and the intermediate plate 12, and is connected to the external lateral surface terminal 32.

It is noted that preferably, a width W of the terminal wiring 26, in the direction (the Y axis direction in the drawing) intersecting an extending direction (the X axis direction in the drawing) from a position facing the second interlayer wiring 35 toward the external lateral surface terminal 32, is set to equal to or greater than 0.05 mm and equal to or smaller than 0.3 mm. The providing of the external lateral surface terminal 32 in the size of the width W can easily form the wiring (the external lateral surface terminal 32), and while securing conductivity reliability of the wiring (the external lateral surface terminal 32), can make it difficult to have an influence of a change in characteristic, such as the change in resonance characteristic of the quartz crystal resonator element 17, which occurs due to capacitive coupling to other wiring, or the like.

Furthermore, more preferably, the size of the width W of the terminal wiring 26, in the direction (the Y axis direction in the drawing, in the present example) intersecting the extending direction (the X axis direction in the drawing) from the position facing the second interlayer wiring 35 toward the external lateral surface terminal 32, is set to equal to or greater than 0.2 mm and equal to or smaller than 0.25 mm. In this manner, an increase in a lower limit value of the size of the width W of the external lateral surface terminal 32 can perform easier formation and can secure the conductivity reliability of the wiring (the external lateral surface terminal 32). Furthermore, a decrease in an upper limit value can make it further difficult to have the influence of the change in characteristic, such as the change in resonance characteristic of the quartz crystal resonator element 17, which occurs due to the capacitive coupling to other wiring.

Figure 7A:
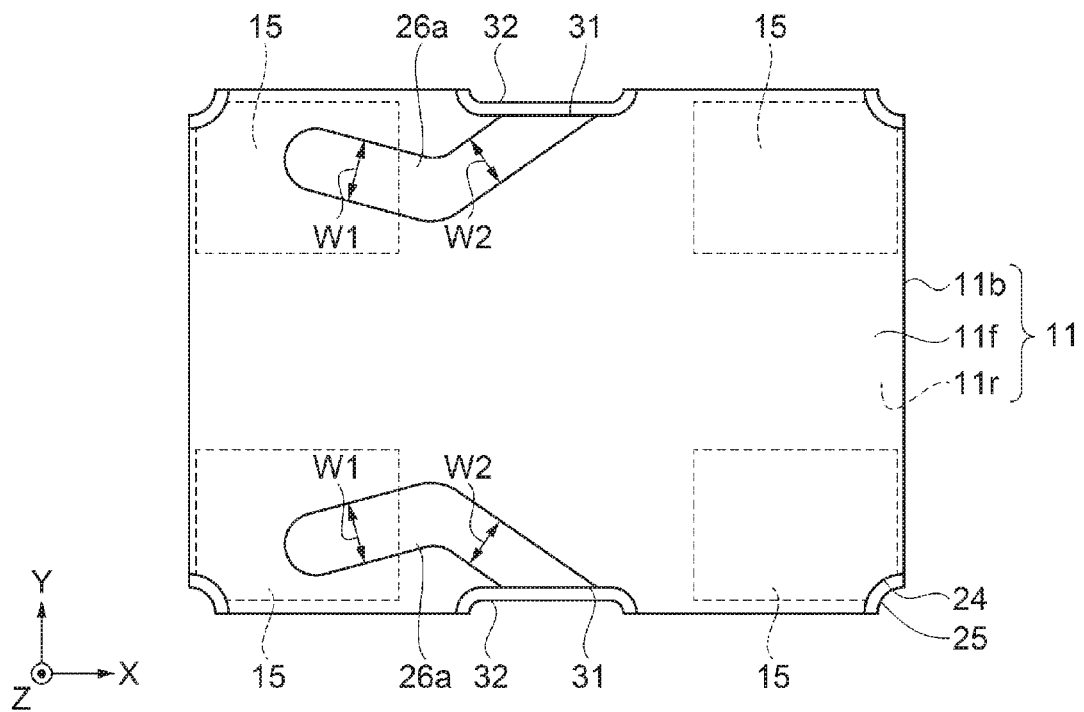
FIG. 7A is a plan diagram illustrating a modification example of terminal wiring.

It is noted that the terminal wiring 26 is not limited to the configuration of the wiring pattern that, as described above, extends mostly in one direction is imposed, and for example, may be in a wiring pattern in which the band-shaped wiring has a curvature or a curve in the shape of a wave, or as illustrated in FIG. 7A, a plan diagram, may be in a wiring pattern in the shape of a band, which is refracted in two extending directions that intersect each other. It is noted that in an example in FIG. 7A, a width W1 and a width W2 of band-shaped wiring in the two extending directions, which constitutes a terminal wiring 26a, may be different from each other, and may be the same.

Figure 7B:
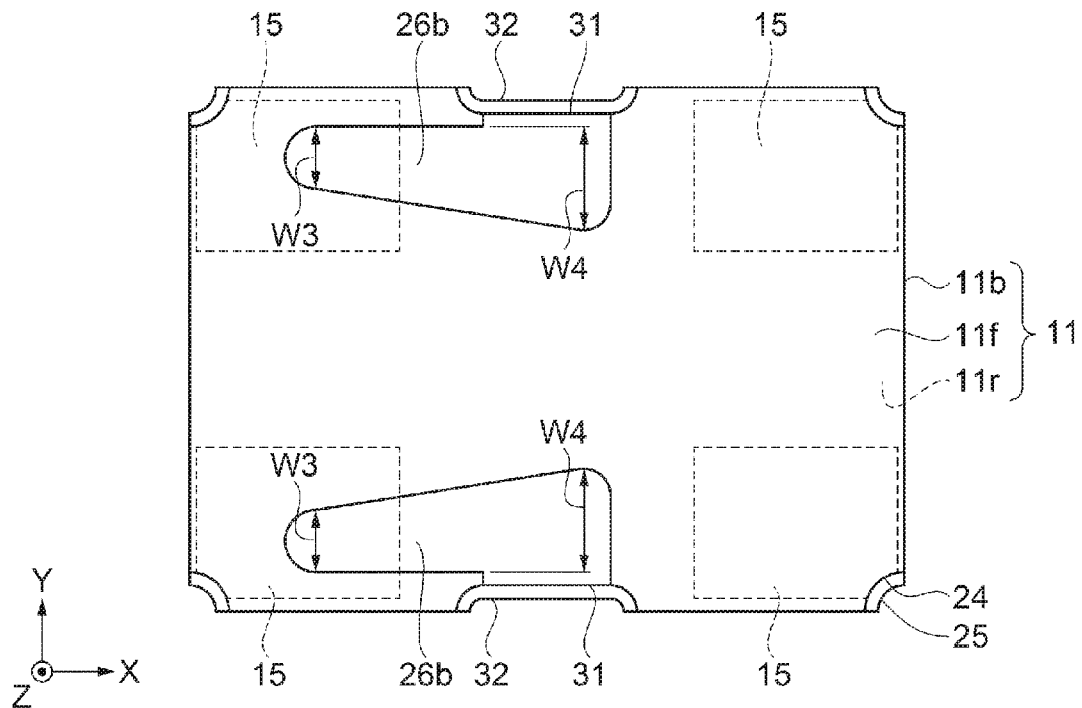
FIG. 7B is a plan diagram illustrating another modification example of the terminal wiring.

Furthermore, as is the case with a terminal wiring 26b that is illustrated in FIG. 7B, the width W in the direction intersecting the extending direction of the terminal wiring 26*b* may not be in a wiring pattern that extends in the same width W, and may be configured to be in a wiring pattern that has a wide width portion or a narrow width portion, and extends in the width W which is gradually widened or in the width W which is gradually narrowed. It is noted that the terminal wiring 26*b* that is illustrated in FIG. 7B, a plan diagram, illustrates an example of a configuration of a wiring pattern that is gradually widened from a width W3 on the second interlayer wiring 35 side to a width W4 on the external lateral surface terminal 32 side.

Four external connection terminals 15 that correspond to castellations 24, respectively are provided on the ear surface 11*r* of the base plate 11 that is a base surface of the package 20, and are connected to the castellation electrodes 25. The castellation electrode 25 that is connected to the external connection terminal 15 is provided, and thus, at the time of the mounting into the package 20, for example, crawling-up of solder (a solder fillet) is easy to form, and reliability of the mounting can be improved.

The sidewall 14 that is joined to the front surface 13*f* side of the frame plate 13 has an opening that has an opening end more outward than an opening in the frame plate 13 in the X axis direction and the Y axis direction, and is provided, in the shape of a frame that is approximately rectangle-shaped, along a peripheral portion (an external lateral portion), on an upper surface (the front surface 13*f* of the frame plate 13) of the package 20 in which the frame plate 13 is stacked from the base plate 11. In other words, the shape of an opening in the sidewall 14, which is exposed to the upper surface of the concavity portion of the package 20, is a peripheral shape in the shape of approximately a rectangle, the sidewall 14 has the front surface 14*f* and the rear surface 14*r* that is opposite in direction to the front surface 14*f*, and the rear surface 14*r* is joined to the front surface 13*f* of the frame plate 13.

The seam ring 29 that is formed of alloy, for example, such as a nickel-cobalt ferrous alloy that uses the trademark Kovar, is provided on the front surface 14*f* that is opposite in direction to the frame plate 13 side of the frame-shaped sidewall 14. The seam ring 29 has a function of serving as a material that joins the lid 30 as the cover part and the sidewall 14, and is provided, in the shape of a frame (the peripheral shape in the shape of approximately a rectangle), along the front surface 14*f* of the sidewall 14.

The package 20 is formed of a material that has a coefficient of thermal expansion that is consistent with or is as close as possible to a coefficient of thermal expansion of each of the quartz crystal resonator element 17, the circuit element 21, and the lid 30, and in the present example, ceramics is used as the material. The package 20 is formed by stacking green sheets that are formed in a predetermined shape, and sintering the stacked green sheets. It is noted that, for example, the green sheet is a material that results from forming into the shape of a sheet a kneaded mixture that is generated by distributing powder of ceramics into a predetermined solution and adding a binder.

Electrodes and pieces of wiring, such as the external connection terminal 15, the castellation electrode 25, the terminal wiring 26, the connection pad 28, the external lateral surface terminal 32, the junction electrode 34, the bonding electrodes 23*a*, 23*b*, 23*c*, 23*d*, 23*e*, and 23*f*, and the wiring electrodes 36*a*, 36*b*, 36*c*, 36*d*, 36*e*, and 36*f*, for example, can be formed of tungsten or the like. For example, burning is performed after forming a necessary shape (a pattern), using tungsten metalizing, and thereafter, these electrodes, wiring, and the like can be formed by performing plating using nickel and gold, silver, or the like. It is noted that, for these electrodes and pieces of wiring, in addition to the tungsten metalizing described above, for example, silver or palladium, or the like can be used mostly as a conductive paste. In this case, when it comes to a shape that is necessary due to the conductive base, patterning of the shape is performed, hardening (drying) processing is then performed, and thus the e can be formed. Furthermore, these electrodes, wiring, or the like can be formed using other methods, such as a sputtering method that uses tungsten or the like, or an evaporation method.

Furthermore, arrangement or quantities of the external connection terminal 15, the cast nation electrode 25, the terminal wiring 26, the connection pad 28, the external lateral surface terminal 32, the junction electrode 34, the bonding electrodes 23*a*, 23*b*, 23*c*, 23*d*, 23*e*, and 23*f*, the wiring electrodes 36*a*, 36*b*, 36*c*, 36*d*, 36*e*, and 36*f*, or the like are not limited to the embodiment described above.

Circuit Element

For the electric connection, the circuit element 21 is connected to the bonding electrodes 23*a*, 23*b*, 23*c*, 23*d*, 23*e*, and 23*f*, which are provided on the front surface 11*f* of the base plate 11, through the connection protrusions (the bumps) 22. The circuit element 21, for example, includes at least an oscillation circuit that causes the quartz crystal resonator element 17 to vibrate, or a circuit (a temperature compensation circuit) that has a characteristic, as diametrically opposed to a temperature characteristic that the quartz crystal resonator element 17 has.

Lid

The lid 30 as the cover part is a plate-shaped member, covers an opening in the concavity portion that is exposed to the upper surface of the package 20, and forms the internal space 16. The lid 30 causes surroundings of the opening in the concavity portion, which corresponds to the front surface 14*f* of the sidewall 14, to join each other through the seam ring 29 as a joining material, for example, using a seam welding method or the like. Because the lid 30 in the present example is plate-shaped, it is easy to perform formation of the lid 30, and additionally, the stability of the shape is also excellent.

Furthermore, a conductive nickel-cobalt ferrous alloy that uses the trademark Kovar is used for the lid 30 in the present example.

A plate that is made of a conductive nickel-cobalt ferrous alloy that uses the trademark Kovar is used for the lid 30, and thus the seam ring 29 and the lid 30 that are formed of the conductive nickel-cobalt ferrous alloy which uses the trademark Kovar are molten in the same molten state at the time of the sealing, and additionally, alloying is easy to perform. Because of this, the sealing can be performed easily and reliably. Furthermore, a conductive plate is used for the lid 30, and thus the lid 30 is possibly decided to be a fixed potential. As a result, with the lid 30, a shielding effect can be obtained.

Accordingly, protection against electric noise that is entered from the lid 30 side is possibly provided. It is noted that a plate which is made of another material may be used for the lid 30 instead of the conductive nickel-cobalt ferrous alloy which uses the trademark Kovar and that for example, a metal material, such as 42 alloy or stainless steel, a material that is the same as that of the sidewall 14 of the package 20, or the like can be used.

According to the oscillator 1 as an electronic component that uses the package 20 as an electronic-component package according to the embodiment described above, the terminal wiring 26, which is connected to the external lateral surface terminal 32, is connected to the resonance element wiring 37 that includes the first interlayer wiring 27 as interlayer wiring to the connection pad 28, the junction electrode 34 and the second interlayer wiring 35, and is provided between the intermediate plate 12 as the second layer that does not constitute the internal space 16, and the base plate 11 as the third layer. Because the internal space 16, which is cavity that accommodates the quartz crystal resonator element 17 and the circuit element 21, not configured between the intermediate plate 12 and the base plate 11 and thus a wide plane area is retained, although the terminal wiring 26 is provided, a stacking area of the intermediate plate 12 and the base plate 11 can be sufficiently secured and a stacking strength (joining strength) of the intermediate plate 12 and the base plate 11 can be sufficiently obtained. Accordingly, a concern that the airtightness will deteriorate due to interlayer delamination or the like can be reduced.

It is noted that in a case where the miniaturization of the oscillator 1 advances, because a ratio of an occupied area of the terminal wiring 26 to a plane area of the package 20 is increased, an effect of the present configuration is remarkable.

It is noted that in the embodiment described above, quartz crystal is described as being used as a piezoelectric material of which the quartz crystal resonator element 17 is formed, but that the piezoelectric material is not limited to this and for example, a piezoelectric material can also be used such as lithium tantalate or lithium niobate. Furthermore, the quartz crystal resonator element 17 may employ a configuration which a micro electro mechanical systems (MEMS) element is used that forms a resonance element on a silicon or glass substrate. Furthermore, the quartz crystal resonator element 17 may be a resonance element that has a configuration in which a resonator is formed on the substrate such as a silicon or glass substrate.

Furthermore, the embodiment described above, an example of an electronic component in which the package 20 according to the invention finds application is described, by taking, for example, the oscillator 1 that uses the quartz crystal resonator element 17, but no limitation to this is imposed. For example, the package 20 according to the invention can find application in an electronic component that has other functions, such as a sensor into which a sensor element, such as for acceleration or angular velocity, is built.

Electronic Apparatus

Figure 8:
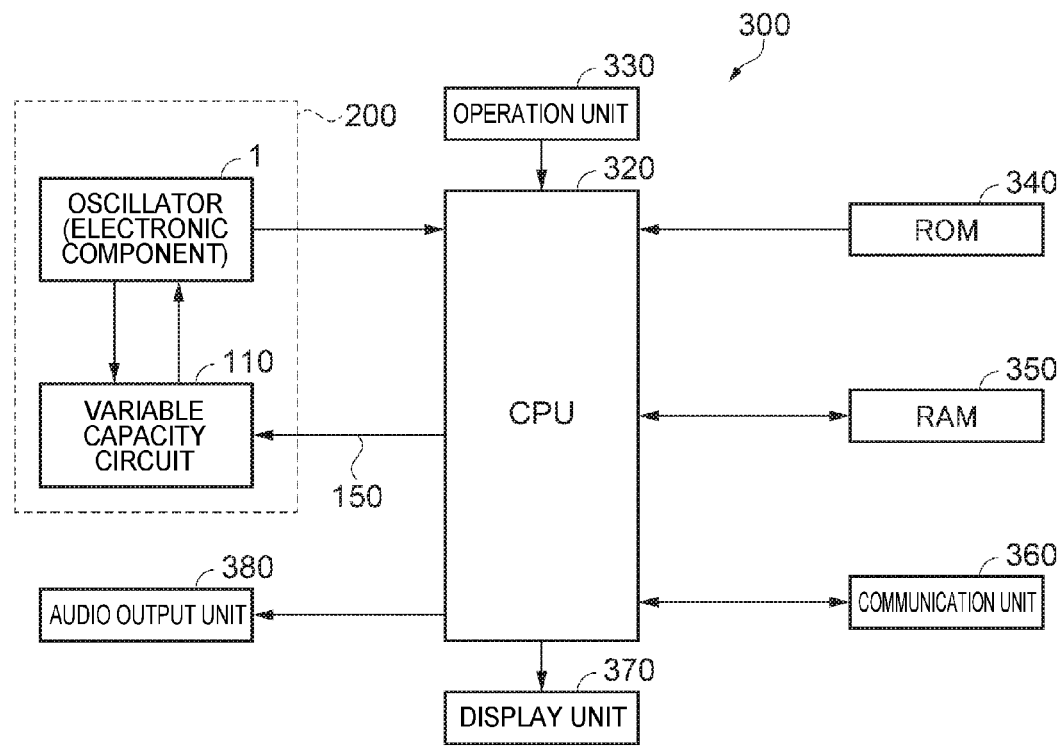
FIG. 8 is a functional block diagram illustrating an example of a configuration of an electronic apparatus that includes an electronic component that uses the electronic-component package.
Figure 9:
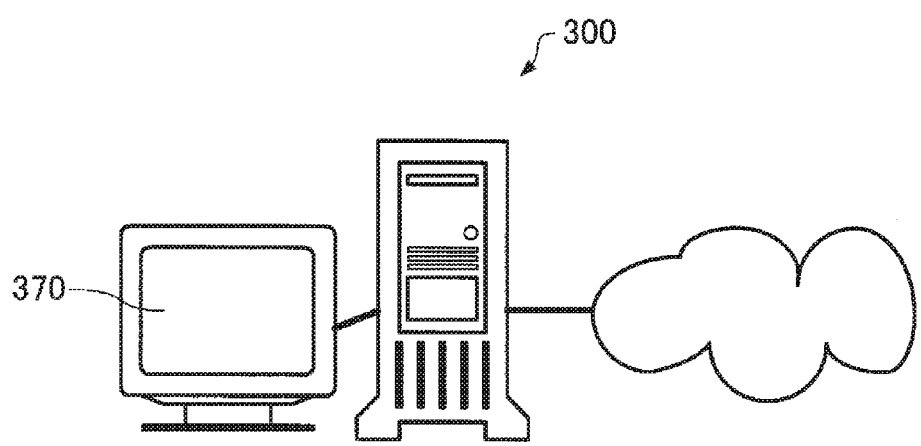
FIG. 9 is a schematic diagram illustrating an example of a configuration of a network server as an example of the electronic apparatus that includes the electronic component which uses the electronic-component package.
Figure 10:
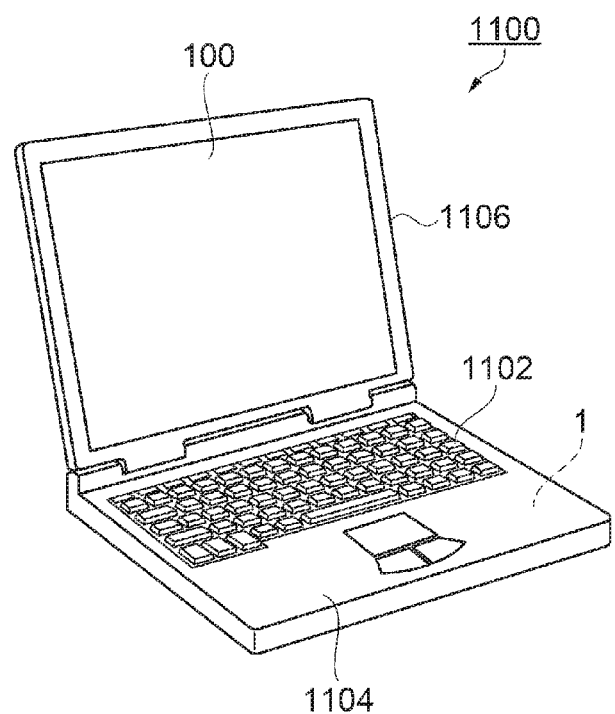
FIG. 10 is a perspective diagram illustrating a configuration of a mobile-type personal computer as an example of the electronic apparatus that includes the electronic component which uses the electronic-component package.
Figure 11:
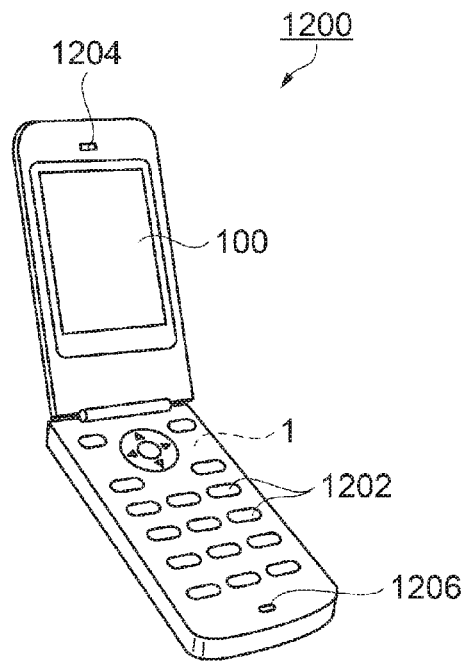
FIG. 11 is a perspective diagram illustrating a configuration of a portable telephone as an example of the electronic apparatus that includes the electronic component which uses the electronic-component package.
Figure 12:
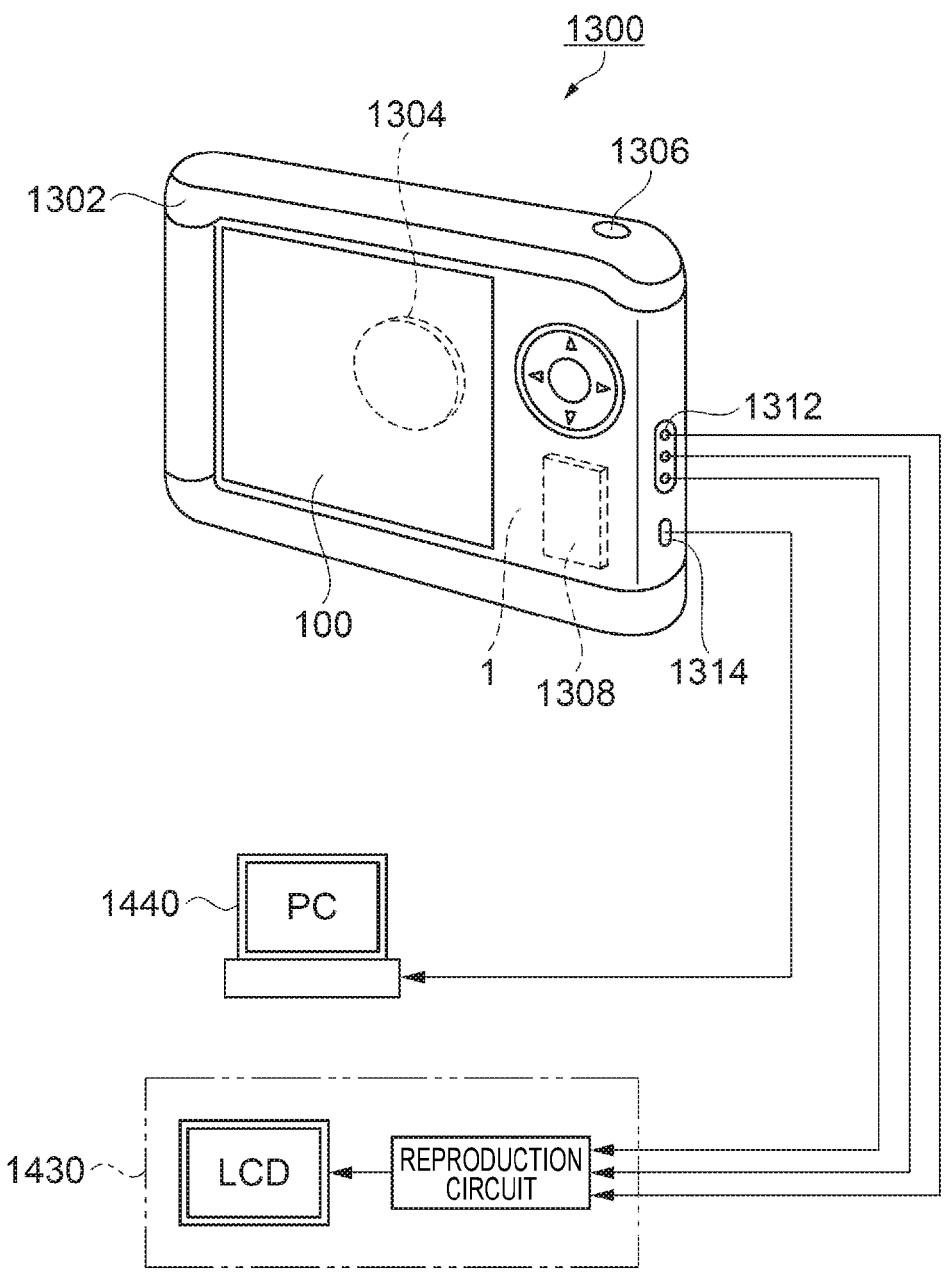
FIG. 12 is a perspective diagram illustrating a configuration of a digital still camera as an example of the electronic apparatus that includes the electronic component which uses the electronic-component package.

Subsequently, an electronic apparatus in which the oscillator 1 as an electronic component that uses the electronic-component package according to the invention finds application is described in detail with reference to FIGS. 8, 9, 10, 11, and 12. FIG. 8 is a functional block diagram illustrating an example of a configuration of the electronic apparatus that includes the electronic component which uses the electronic-component package. FIG. 9 is a schematic diagram illustrating an example of a configuration of a network server as an example of the electronic apparatus that includes the electronic component which uses the electronic-component package. FIG. 10 is a perspective diagram illustrating a configuration of a mobile-type personal computer as an example of the electronic apparatus that includes the electronic component which uses the electronic-component package. FIG. 11 is a perspective diagram illustrating a configuration of a portable telephone as an example of the electronic apparatus that includes the electronic component which uses the electronic-component package. FIG. 12 is a perspective diagram illustrating a configuration of a digital still camera as an example of the electronic apparatus that includes the electronic component which uses the electronic-component package. It is noted that FIG. 12 illustrates a connection to an external apparatus in a simplified manner.

In the following description, an example is described in which the oscillator 1, which includes the quartz crystal resonator element 17 and the circuit element 21 according to the embodiment described above, as the electronic component which uses the electronic-component package, finds application in an electronic apparatus. It is noted that constituent components that are the same as those in FIGS. 1 to 6, with reference to which the oscillator 1 is described are given the same reference numbers, respectively, and descriptions thereof are omitted.

First, a specific example of the electronic apparatus in which the oscillator 1 according to the embodiment described, above finds application is described with reference to FIGS. 8 and 9. An electronic apparatus 300 that is illustrated FIG. 8 is configured to include another electronic component 200 that includes the oscillator 1 as an electronic component, and a variable capacity circuit 110, a central processing unit (CPU) 320, an operation unit 330, a read only memory (ROM) 340, a random access memory (RAM) 350, a communication unit 360, a display unit 370, and an audio output unit 380. It is noted that the electronic apparatus 300 may result from omitting or changing one portion of the constituent element in FIG. 8, and may have a configuration that results from adding another constituent element.

The electronic component 200 includes the variable capacity circuit 110 and the oscillator 1, and supplies a clock signal from the oscillator 1 to each unit as well as the CPU 320 (an illustration of this is omitted).

The CPU 320 performs various types of computing processing and control processing using the clock signal that is output by the electronic component 200, according to a program that is stored in the ROM 340 or the like. Specifically, the CPU 320 performs various types of processing in accordance with an operation signal from the operation unit 330, processing that controls the communication unit 360 in order to perform data communication with the outside, processing that transmits a display signal for causing various pieces of information to be displayed on the display unit 370, processing that causes various type of audio to be output from the audio output unit 380, and the like.

The operation unit 330 is an input device that is configured with an operation key or a button switch, or the like, and outputs an operation signal in accordance with a user operation to the CPU 320.

A program, data, and the like that are necessary for the CPU 320 to perform various types of computing processing or control processing are stored in the ROM 340.

The RAM 350 is used as a working area for the CPU 320, and the program or the data that is read from the ROM 340, data that is input from the operation unit 330, a result of arithmetic operation that is performed by the CPU 320 according to various programs, or the like is stored temporarily in the RAM 350.

The communication unit 360 performs various types of control for establishing data communication between the CPU 320 and an external apparatus.

The display unit 370 is a display device that is configured with a liquid crystal display (LCD) or the like, and various pieces of information are displayed on the display unit 370, based on the display signal that is input from the CPU 320. Then, the audio output unit 380 is a device that outputs audio, such as a speaker.

With a control signal 150 of the CPU 320, the electronic apparatus 300 can adjust setting data of the variable capacity circuit 110. For this reason, even in a case where a deviation in an oscillation frequency of a clock signal occurs, the adjustment can be easily made.

FIG. 9 is a diagram illustrating an example of an external appearance of a network server that is an example of the electronic apparatus 300. The network server that is the electronic apparatus 300 includes an LCD as the display unit 370. Then, in the network server, which is the electronic apparatus 300, with the control signal 150, the setting data of the variable capacity circuit 110 is possibly adjusted. For this reason, even in the case where the deviation in the oscillation frequency of the clock signal occurs, the adjustment can be easily made. As a result, because a precise clock signal can be used, the reliability is increased.

As described above, that high-reliability oscillator 1, which makes it difficult for the deterioration in airtightness to occur in the electronic apparatus 300 and the network server that is an example of the electronic apparatus 300, is utilized, and thus the electronic apparatus 300 and the network server that is an example of the electronic apparatus 300, which have higher reliability, can be provided.

Subsequently, another specific, example of the electronic apparatus to which the oscillator 1 according to the embodiment described above finds application is in detail described with reference to FIGS. 10 to 12.

As illustrated in FIG. 10, a personal computer 1100 is configured with a main body 1104 including a keyboard 1102, a display unit 1106 including a display section 100. The display unit 1106 is supported by a hinge mechanism in such a manner that the display unit 1106 possibly rotated with respect to the main body 1104. The oscillator 1 that is equipped with a function of serving as a timing source for signal processing is built into the personal computer 1100.

As illustrated in FIG. 11, a portable telephone 1200 includes a plurality of operation buttons 1202, an ear piece 1204, and a mouth piece 1206. The display section 100 is positioned between the operational buttons 1202 and the ear piece 1204. The oscillator 1 that includes the function of serving as the timing source for the signal processing is built into the portable telephone 1200.

As illustrated in FIG. 12, a digital still camera 1300 has a configuration in which the display section 100 is provided on a rear surface of a case (a body) 1302 of the camera and display is performed based on a signal that is image-captured by a CCD.

The display section 100 that is equipped with a function of serving as a finder on which a photographic subject is displayed as an electronic image. Furthermore, a light receiving unit 1304 that includes an optical lens (an imaging optical system), a CCD, and the like is provided on the front surface side (the rear surface side in the drawing) the case 1302.

At this point, while a film camera in the related art exposes an analog photographic film using a light image of a photographic subject, the digital still camera 1300 generates an imaging signal (an image signal) by performing photoelectric conversion on the light image of the photographic subject using an imaging element, such as a charge coupled device (CCD).

When a photographer checks an image of the photographic subject that is displayed on the display section 100 and pushes down on a shutter button 1306, the imaging signal of CCD at a point in time is transferred to a memory 1308 for storage.

Furthermore, in the digital still camera 1300, a video signal output terminal 1312 and an input and output terminal 1314 for data communication are provided on a lateral surface of the case 1302. Then, as illustrated, if necessary, a television monitor 1430 is connected to the video signal output terminal 1312, and a personal computer 1440 is connected to the input and output terminal 1314 for data communication. Moreover, a configuration is employed in which with a predetermined operation, the imaging signal that is stored in the memory 1308 is output to the television monitor 1430 or the personal computer 1440. The oscillator 1 that is equipped with the function of serving as the timing source for the signal processing is built into the digital still camera 1300.

As illustrated above, the oscillator 1 that has the higher reliability which makes it difficult for the deterioration in airtightness to occur is utilized in the personal computer 1100, the portable telephone 1200, and the digital still camera 1300, as electronic apparatuses, and thus the personal computer 1100, the portable telephone 1200, and the digital still camera 1300, as higher-reliability electronic apparatuses, can be provided.

It is noted that in addition to the personal computer (the mobile-type personal computer) in FIG. 10, the portable telephone in FIG. 11, and the digital still camera in FIG. 12, the oscillator 1 as the electronic component that uses the electronic-component package can find application, for example, in electronic apparatuses, such as an ink jet type discharge apparatus (for example, an ink jet printer), a laptop type personal computer, a television, a video camera, videotape recorder, a car navigation apparatus, a pager, an electronic notebook (which is also equipped with a communication function), an electronic dictionary, a calculator, an electronic game machine, a word processor, a workstation, a video phone, a crime-prevention television monitor, electronic binoculars, a POS terminal, a medical apparatus (for example, a clinical electronic thermometers, a sphygmomanometer, a blood sugar meter, an electrocardiographic apparatus, a ultrasonic diagnostic apparatus, or an electronic endoscopy), a fish detector, various measuring apparatuses, a gauge (for example, a gauge for vehicle, airplane, or ship), a flight simulator, a head mounted display, motion trace, motion tracking, a motion controller, and pedestrian position direction (PDR). It is noted that the oscillator 1 described above or the like that is equipped with a temperature compensation function and because of this, is preferably used for an electronic apparatus that is used under a situation where temperature varies widely, such as a communication base station.

Vehicle

Figure 13:
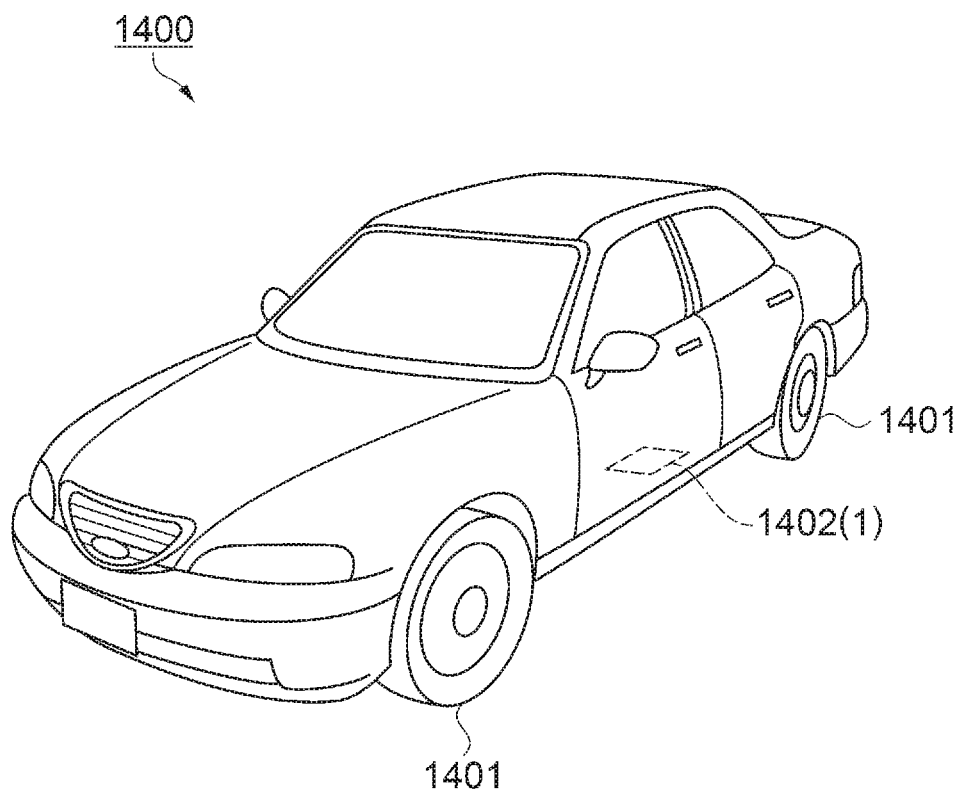
FIG. 13 is a perspective diagram illustrating a configuration of an automobile as a vehicle that includes the electronic component that uses the electronic-component package.

A vehicle, as the electronic component that uses the electronic-component package, in which the oscillator 1 that includes the quartz crystal resonator element 17 and the circuit element 21 according to the embodiment described above finds application is described with reference to FIG. 13. FIG. 13 is a perspective diagram illustrating a configuration of an automobile as the vehicle that includes the electronic component that uses the electronic-component package.

An automobile 1400 is equipped with a gyro sensor that is configured to include the oscillator 1. For example, as illustrated in FIG. 13, the automobile 1400 as a vehicle is equipped with an electronic control unit 1402 into which the gyro sensor that controls a tire 1401 is mounted. Furthermore, another example, the oscillator 1 can find wide application in keyless entry, an immobilizer, a car navigation system, a car air-conditioner, an anti-lock brake system (ABS), an air bag, a tire pressure monitoring system (TPMS), engine control, a braking system, monitoring of a battery in a hybrid car or an electric car, an electronic control unit (ECU), such as a vehicle body posture control system, or an advanced driver assistance system (ADAS) (automatic drive assistance system).

As described above, the higher-reliability oscillator 1 that makes it difficult for the deterioration in airtightness to occur is utilized in the automobile 1400 as a vehicle, and thus a higher-reliability vehicle (the automobile 1400) can be provided.

The electronic apparatus and the vehicle in which the oscillator 1 finds application as the electronic component that uses the electronic-component package according to the invention are described above based on the embodiment that is illustrated, but without the invention being limited to this, a configuration of each unit can be replaced with an arbitrary configuration in which the same function is retained.

Furthermore, other arbitrary constituents may be added to the invention. Furthermore, the embodiments described above may be preferably combined.

Base Station Apparatus

Figure 14:
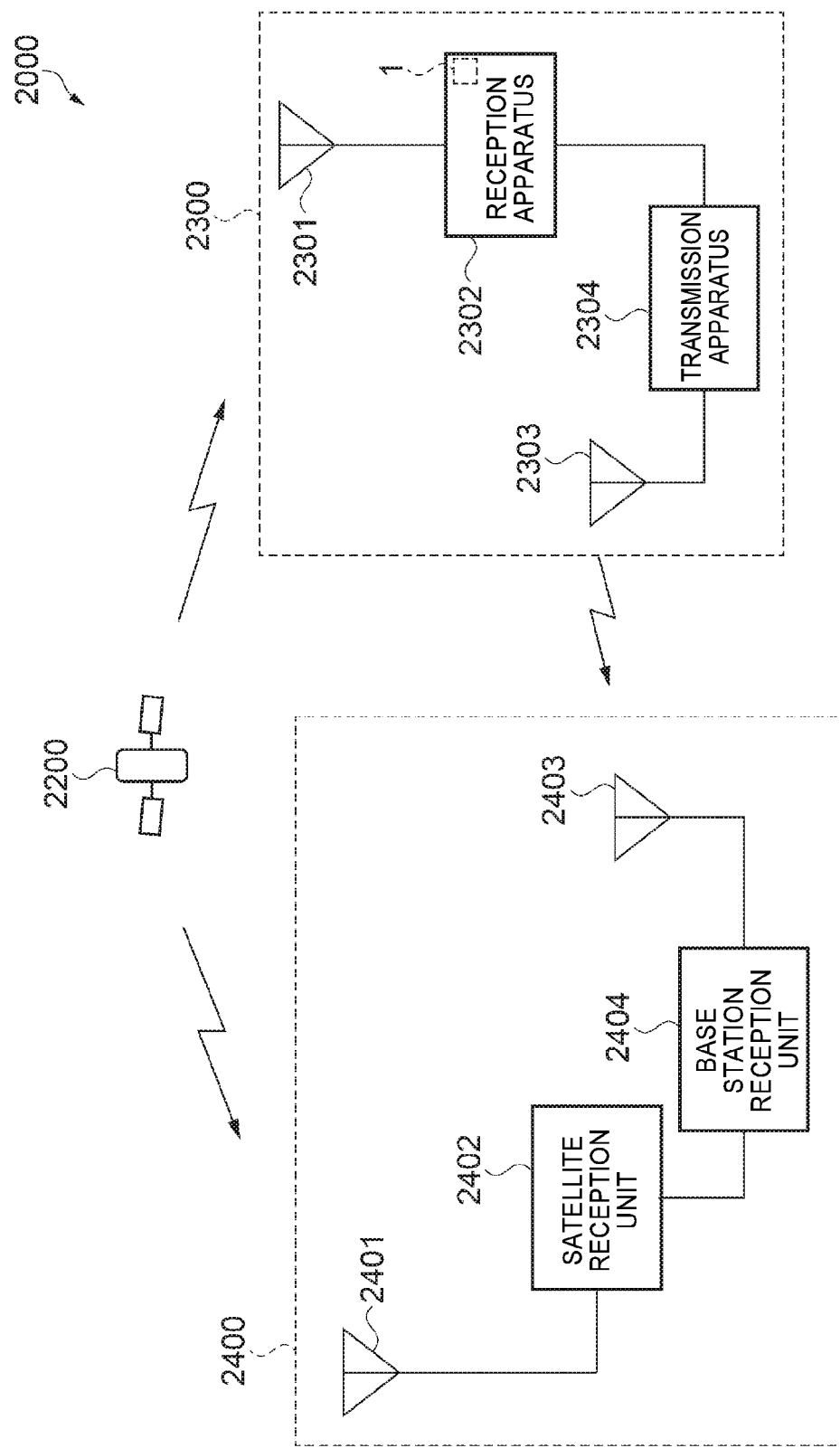
FIG. 14 is a functional block diagram illustrating an example of a configuration of a positioning system in which a base station apparatus that includes the electronic component which uses the electronic-component package finds application.

The oscillator 1 that includes the quartz crystal resonator element 17 and the circuit element 21 according to the embodiment described above, as the electronic component that uses the electronic-component package, can find application in a base station apparatus. The base station apparatus in which the oscillator 1 finds application will be described below with reference to FIG. 14. FIG. 14 is a functional block diagram illustrating an example of a configuration of a positioning system in which the base station apparatus that includes the electronic component which uses the electronic-component package finds application.

As illustrated in FIG. 14, a positioning system 2000 configured with a GPS satellite 2200, abase station apparatus 2300, and a GPS reception apparatus 2400. The GPS satellite 2200 transmits positioning information (a GPS signal).

The base station apparatus 2300, for example, includes a reception apparatus 2302 that, with high precision, receives the positioning information from the GPS satellite 2200 through an antenna 2301 that is installed, for example, at an electronic reference point (GPS continuous observation office), and a transmission apparatus 2304 that transmits the positioning information that is received in the reception apparatus 2302, through an antenna 2303.

At this point, the reception apparatus 2302 is an electronic apparatus that includes the oscillator 1 as a reference frequency oscillation source for the reception apparatus 2302, which is described above. The reception apparatus 2302 has excellent reliability. Furthermore, the positioning information that is received in the reception apparatus 2302 is transmitted in real time by the transmission apparatus 2304. The GPS reception apparatus 2400 includes a satellite reception unit 2402 that receives the positioning information from the GPS satellite 2200 through an antenna 2401, and a base station reception unit 2404 that receives the positioning information from the base station apparatus 2300 through an antenna 2403.

As described above, the high-reliability oscillator 1, as the electronic component that uses the electronic-component package, which makes it difficult for the deterioration in airtightness to occur is utilized in the base station apparatus 2300 that constitutes the positioning system 2000, and thus the higher-reliability base station apparatus 2300 can be provided.

What is claimed is:

1. An electronic-component package comprising:
a first layer that has an opening portion and on which a resonance element is mounted;
a second layer that covers the opening portion and is joined to the first layer, and on which a circuit element is mounted in the opening portion;
a third layer that is joined to a surface of the second layer, which is opposite in direction to a surface of the second layer, on which the circuit element is mounted;
a connection pad that is provided on the first layer and is connected to the resonance element;
an external lateral surface terminal;
terminal wiring that is positioned between the third layer and the second layer and connected to the external lateral surface terminal; and
interlayer wiring that is connected between the connection pad and the terminal wiring to electrically connect the connection pad to the external lateral surface terminal through the terminal wiring.

2. The electronic-component package according to claim 1,
wherein a width of the terminal wiring is equal to or greater than 0.05 mm and is equal to or smaller than 0.3 mm.

3. The electronic-component package according to claim 1,
wherein a width of the terminal wiring is equal to or greater than 0.2 mm and is equal to or smaller than 0.25 mm.

4. The electronic-component package according to claim 1,
wherein at least wiring that is electrically connected to the circuit element is provided on the second layer, and
wherein, among the pieces of wiring, wiring that is electrically connected to the circuit element and is not connected to the resonance element is positioned in a position that does not overlap the resonance element wiring when viewed from above.

5. The electronic-component package according to claim 1,
wherein the external lateral surface terminal is positioned on external lateral surfaces of the first layer and the second layer, and is provided across the first layer and the second layer.

6. An oscillator comprising:
the electronic-component package according to claim 1;
a resonance element that is accommodated in the electronic-component package; and
a circuit element that includes at least an oscillation circuit of the resonance element.

7. An oscillator comprising:
the electronic-component package according to claim 2;
a resonance element that is accommodated in the electronic-component package; and
a circuit element that includes at least an oscillation circuit of the resonance element.

8. An oscillator comprising:
the electronic-component package according to claim 3;
a resonance element that is accommodated in the electronic-component package; and
a circuit element that includes at least an oscillation circuit of the resonance element.

9. An oscillator comprising:
the electronic-component package according to claim 4;
a resonance element that is accommodated in the electronic-component package; and
a circuit element that includes at least an oscillation circuit of the resonance element.

10. An oscillator comprising:
the electronic-component package according to claim 5;

a resonance element that is accommodated in the electronic-component package; and a circuit element that includes at least an oscillation circuit of the resonance element.

11. An electronic apparatus comprising:
an electronic component that includes the electronic-component package according to claim 1.

12. An electronic apparatus comprising:
an electronic component that includes the electronic-component package according to claim 2.

13. An electronic apparatus comprising:
an electronic component that includes the electronic-component package according to claim 3.

14. An electronic apparatus comprising:
an electronic component that includes the electronic-component package according to claim 4.

15. An electronic apparatus comprising:
an electronic component that includes the electronic-component package according to claim 5.

16. A vehicle comprising:
the electronic-component package according to claim 1.

17. A vehicle comprising:
the electronic-component package according to claim 2.

18. A vehicle comprising:
the electronic-component package according to claim 3.

19. A vehicle comprising:
the electronic-component package according to claim 4.

20. A vehicle comprising:
the electronic-component package according to claim 5.

* * * * *